United States Patent [19]
Chiu

[11] Patent Number: 5,359,493
[45] Date of Patent: Oct. 25, 1994

[54] THREE DIMENSIONAL MULTI-CHIP MODULE WITH INTEGRAL HEAT SINK

[75] Inventor: Anthony M. Chiu, Richardson, Tex.

[73] Assignee: Texas Instruments Incorporated, Dallas, Tex.

[21] Appl. No.: 88,996

[22] Filed: Jul. 9, 1993

[51] Int. Cl.⁵ .............................. H05K 7/20
[52] U.S. Cl. .............................. 361/719; 257/719; 361/709; 361/789; 439/67
[58] Field of Search .............. 439/67, 68, 79, 77, 439/485; 165/80.3, 80.4, 185; 174/16.3; 257/706, 707, 713, 719, 723, 724, 727; 361/688-690, 699, 702-704, 707, 709, 719, 729, 735, 736, 749, 760, 774, 777, 784, 788, 789

[56] References Cited

U.S. PATENT DOCUMENTS

| | | | |
|---|---|---|---|
| 3,480,837 | 11/1969 | Feldmann | 361/707 |
| 3,518,493 | 6/1970 | Bathrick, Jr. | 361/707 |
| 4,509,098 | 4/1985 | DasGupta | 361/749 |
| 4,597,617 | 7/1986 | Enochs | 361/749 |
| 4,958,260 | 9/1990 | Kobayashi | 361/749 |
| 5,019,940 | 5/1991 | Clemens | 361/719 |
| 5,067,280 | 11/1991 | Karnezos | 165/185 |
| 5,276,584 | 1/1994 | Collins | 361/718 |
| 5,278,724 | 1/1994 | Angulas | 361/707 |

*Primary Examiner*—Gerald P. Tolin
*Attorney, Agent, or Firm*—Wade James Brady; Richard L. Donaldson

[57] ABSTRACT

The invention is to a three dimensional circuit module constructed around a heat sink 10. A large integrated circuit component 21 such as a Micro Processing Unit for a computer is mounted over contact pads 27 on a printed wiring board 20. Also mounted to contact pads 27 on the printed wiring board are submodules 11, 12, 24, 25 that have wiring patterns interconnected to other circuit components 13-17, such as high power memory devices. The printed circuit submodules are mounted on the sides of the heat sink.

11 Claims, 5 Drawing Sheets

THREE DIMENSIONAL MULTI-CHIP MODULE WITH INTEGRAL HEAT SINK

FIELD OF THE INVENTION

This invention relates to semiconductor devices, and more particularly to a three dimensional multi-chip module integrated with a heat sink.

BACKGROUND OF THE INVENTION

Due to the increasing number of functions integrated into single semiconductor devices, such as the Micro Processor Unit (MPU) used in computers, heat dissipation becomes an important consideration and necessity. Heat sink structures and cooling fans are mounted directly on top of the MPU to dissipate heat. This direct mounting of heat dissipation devices is in addition to cooling fans associated with the power supply in the computer.

In present day processors, the MPUs execute all the functions of a 10 year old CPU (Central Processing Unit) of a mainframe computer. These MPUs execute instructions, fetch, decode, execute floating point and integer arithmetic as well as memory management.

Also a consideration, particularly in new high speed Central Processing Units, is the electrical performance of the circuitry at high. Devices with short leads, such as Surface Mount, TAB, and Pin Grid Array have been used. However, there are still requirements for electrical conductors on the circuit board to connect to other components, including cache memory devices. It is desirable to have connections between the MPU and cache memory devices to be as short as possible since access to these memories hinders the throughput of the MPU.

In order to arrange the largest number of components onto a Printed Wiring Board (PWB), a new packaging design which utilizes the third dimension is implemented.

SUMMARY OF THE INVENTION

The invention is to a three dimensional circuit module constructed around a heat sink. A large integrated circuit, assembled using a Tape Automatic Bonding (TAB), component such as a MPU for a computer system, is placed over contact pads on a PWB. Also mounted to contact pads on the PWB are submodules with mating pads on a flexible circuit. These submodules are constructed by mounting the components on a smaller printed wiring board and attaching a Flexible Circuit Connector (FCC). These submodules are smaller printed circuit boards with components such as Application Specific Integrated Circuits (ASIC) and high density, fast memory devices. They are fully tested in module form before use. The printed submodules are attached on the sides of a heat sink that is also mounted over the MPU on the PWB during final assembly. The MPU and the components on the submodules are connected via the conductors on the PWB, FCC and contact pads. The entire assembly of MPU, submodules, and heat sink are held in place by locating pins on the PWB and heat sink, and the heat sink is secured to the PWB by screws. The clamping effect of the heat sink secured to the PWB establishes connection between the MPU, and the submodules.

The three dimensional multi-chip modules with integral heat sink includes an integrated circuit MPU mounted on a printed wiring board having electrical contacts and conductors thereon, a heat sink mounted over the integrated circuit (MPU), and a plurality of submodules, having semiconductor devices thereon, mounted on sides of the heat sink, and extending under the heat sink making electrical contact with the circuit board and the integrated circuit (MPU) through a flexible circuit connector.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
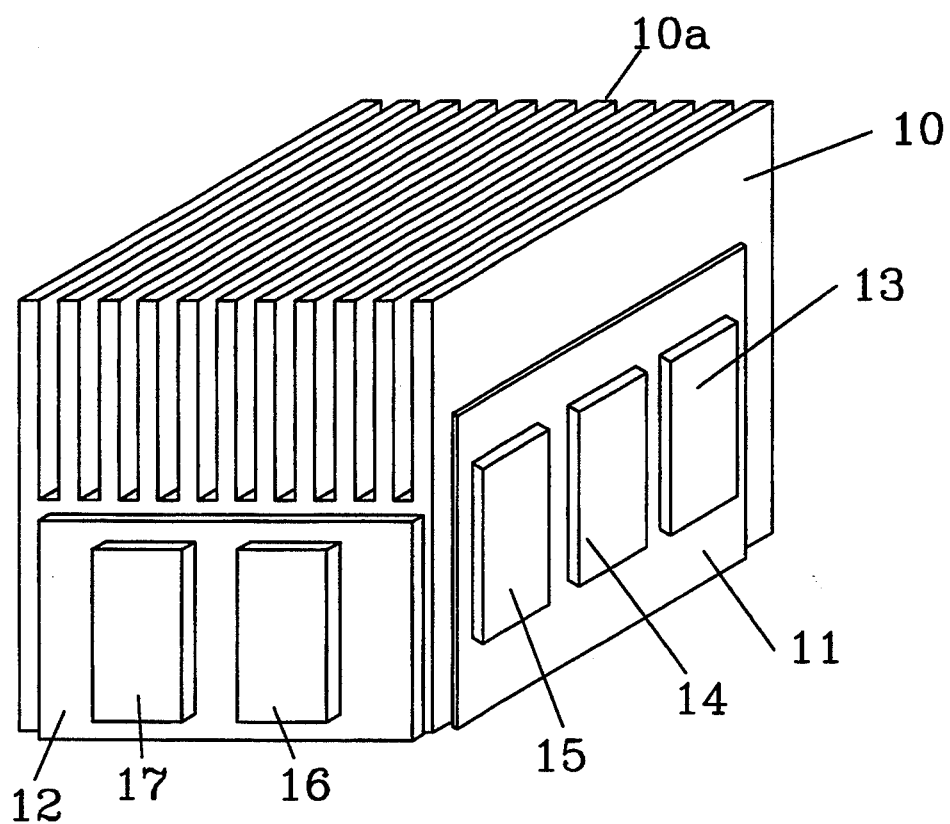
FIG. 1 shows a heat sink with flexible printed circuit modules on the sides of the heat sink.

FIG. 1 shows a heat sink 10 with submodules 11 and 12, made from mounting components on a smaller printed wiring board (PWB) and attached to a flexible circuit connector (FCC) adjacent two of sides of the heat sink. The PWB and FCC can be one or more pieces joined together by soldering. Submodule 11 has three semiconductor devices 13, 14 and 15 on the module. Submodule 12 has two semiconductor devices 17 and 16 mounted thereon. Modules 11 and 12 are, for example, flexible printed circuit boards, with the semiconductor devices connected to conductors on the outer surface (not illustrated) of the flexible circuit board, or in between layers of flexible printed circuit material. Heat sink 10 has a plurality of cooling fins 10a on the top of the heat sink to help dissipate heat produced by the semiconductor devices on the submodules, and the MPU device mounted under the heat sink.

Figure 2:
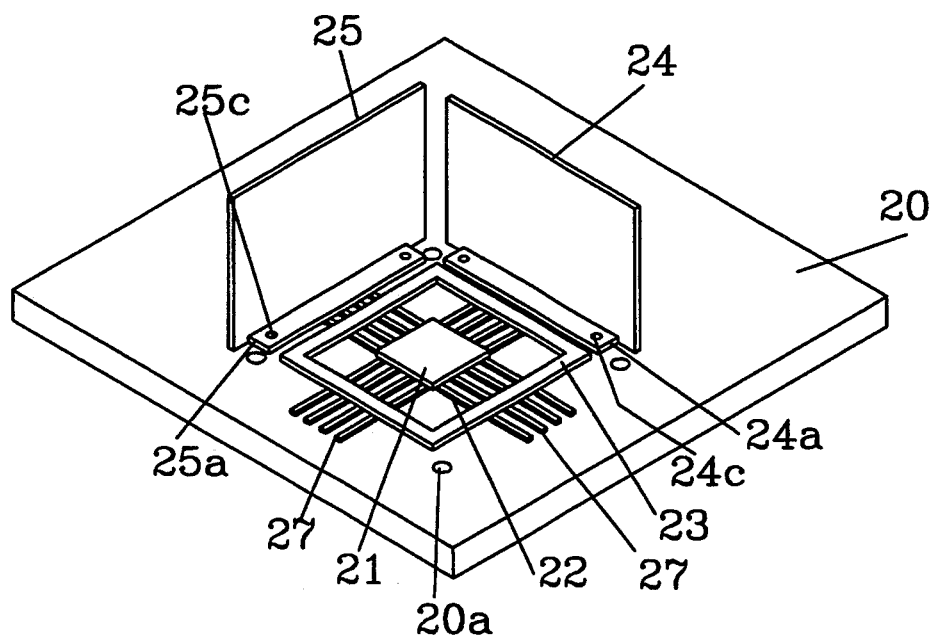
FIG. 2 shows the mounted MPU and two printed circuit submodules connected to flexible circuits with the heat sink removed.

FIG. 2 shows a MPU 21 assembled using Tape Automated Bonding (TAB) mounted on printed circuit board 20. The heat sink has been removed as well as two of the submodules. Leads 22 connect with modules 24 and 25. Leads 26 (FIG. 3) extend under the lower portion 25a of module 25, are connected to pads 27 on the PWB. Pads 27 established electrical contact between MPU 21 and the devices on submodule 25 when the heat sink is installed. Similarly, submodule 24 and MPU 21 are connected in a similar manner. Locating holes, 24c on submodule 24 and 25c on module 25, provide positive positioning of the circuit board modules over pads 27. There are two locating holes on each module. Heat sink mounting holes 20a on printed wiring board 20 are used to screw-mount the heat sink to the printed wiring board 20.

Figure 2A:
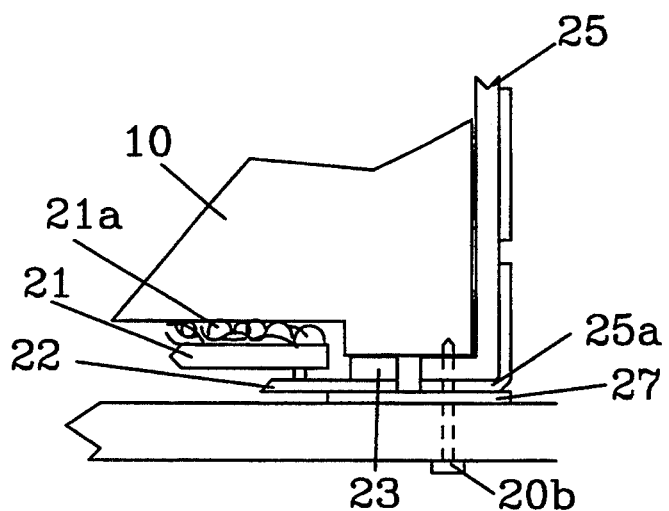
FIG. 2a is a partial side view showing a submodule and the MPU mounted on the printed wiring board.

FIG. 2a shows TAB frame 23 with leads 22, and MPU 21 mounted over PWB contact pads 27. Module 25 is also in contact with contact pads 27. Screw 20b attaches heat sink 10 over MPU 21 and submodule connector 25a, holding them in contact with the contact pads 27. A thermally conductive gel 21a is often used to provide better heat dissipation. The TAB lead 22, pad 27 and connector 25a may be gold plated for better electrical contact.

Figure 3:
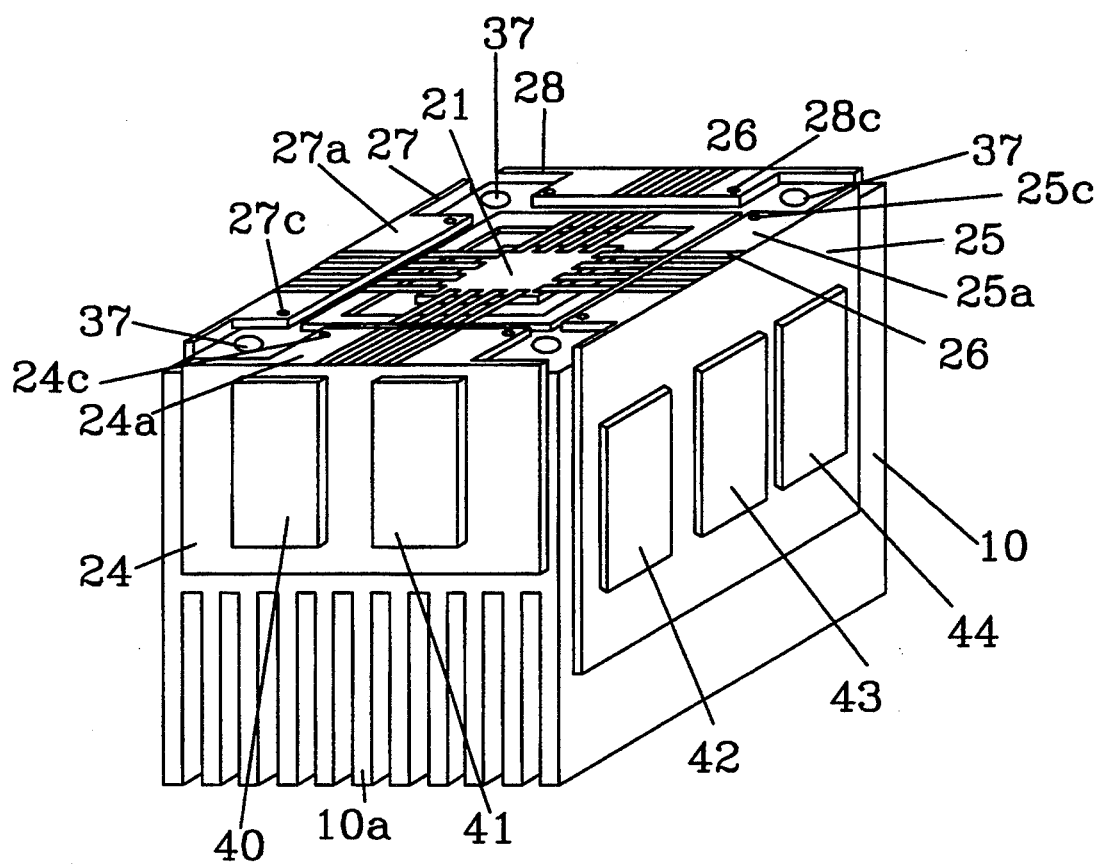
FIG. 3 shows bottom view of the heat sink, MPU and four flexible circuit printed circuit board submodules.

FIG. 3 is a bottom view of the complete heat sink and circuit module assembly. Heat sink 10 has four circuit modules, one on each vertical face. Modules 24 and 25 are shown. Each of the four modules has base portions 24a, 25a, 27a and 28a. Each base portion has a pair of pin alignment holes 24c, 25c, 27c and 28c. Because the cooling fins 10a of heat sink 10 extend into the heat sink body, end modules 24 and 28 are smaller than the circuit modules 25 and 27. Devices 40-44 are connected to the MPU 21 and other circuitry on the modules via conductors on the modules (not illustrated) or by conductors between the module layers, when the modules are multi-layer circuit boards. The base of heat sink 10 has four mounting holes 37, used to secure the heat sink over the MPU 21 and the pin located portions of the submodules to the printed wiring board (20 in FIG. 2).

Figure 4:
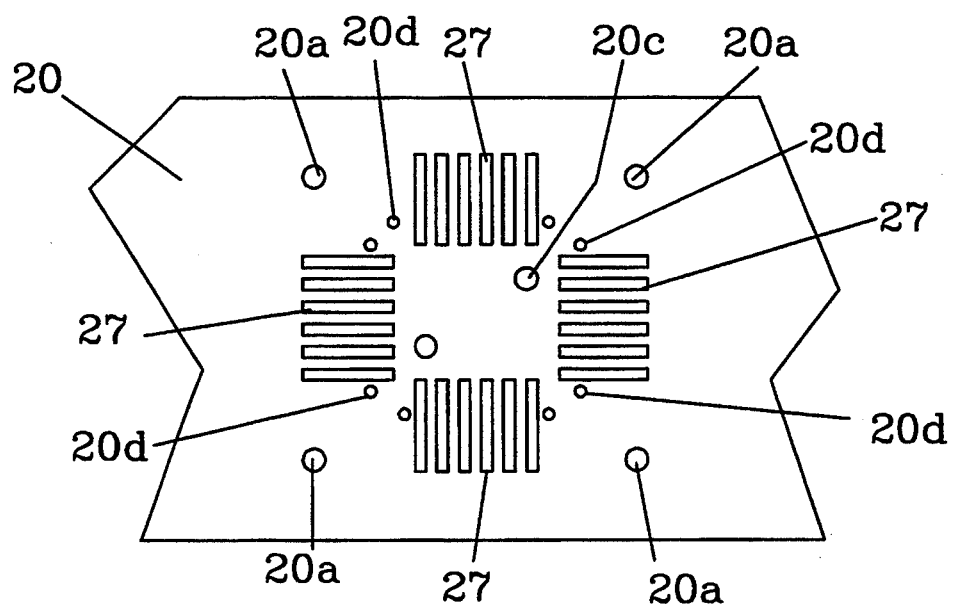
FIG. 4 shows the contact pads, mounting holes and locating pins on the printed wiring board.

FIG. 4 shows the relative location of the various mounting holes and locating pins. Printed wiring board 20 has the four arrays of contact pads 27. On each side of each array of contact pads is a pin 20d for locating the submodules over the contact pads. Four mounting holes 20a are shown, for mounting the heat sink to the printed wiring board 20. Two holes 20c are shown. These holes are used for locating the heat sink over the MPU.

Figure 5:
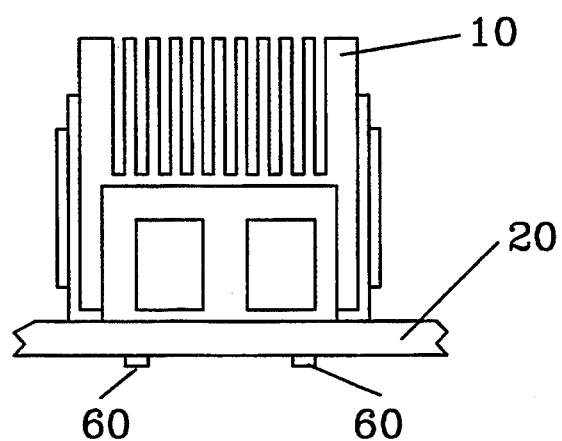
FIG. 5 shows a heat sink and mounting screws mounting the heat sink to a printed wiring board.

In FIG. 5, heat sink 10 is secured in place by screws through the circuit board 20. The heat sink holds the MPU contacts, the submodule contacts in electrical contact with pad contacts (See FIG. 4) on the printed wiring board 20, interconnecting the MPU with the semiconductor devices on the submodules, and with the other circuitry on the module.

Figure 6:
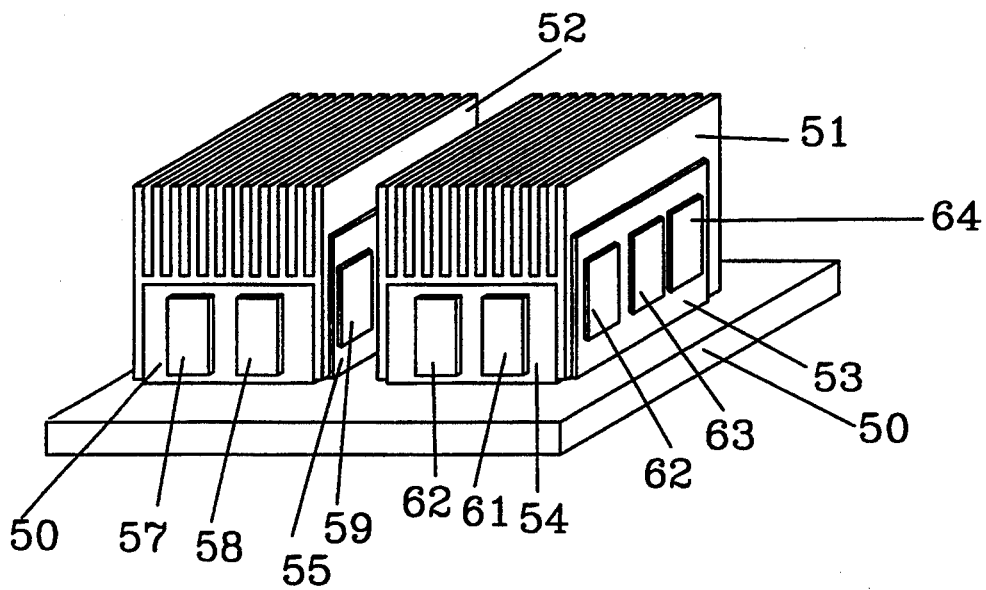
FIG. 6 shows dual heat sink/modules on a printed circuit board.

FIG. 6 shows dual processor modules. Circuit board 50 has two heat sinks 51 and 52 assembled with submodules, for example, modules 53, 54, 55 and 56. Four other modules may be mounted on the back sides of the heat sinks, for a total of eight submodules. The two modules may be for dual processors, or a processor, co-processor and associated high power memory devices and related devices 57-64.

Figure 7:
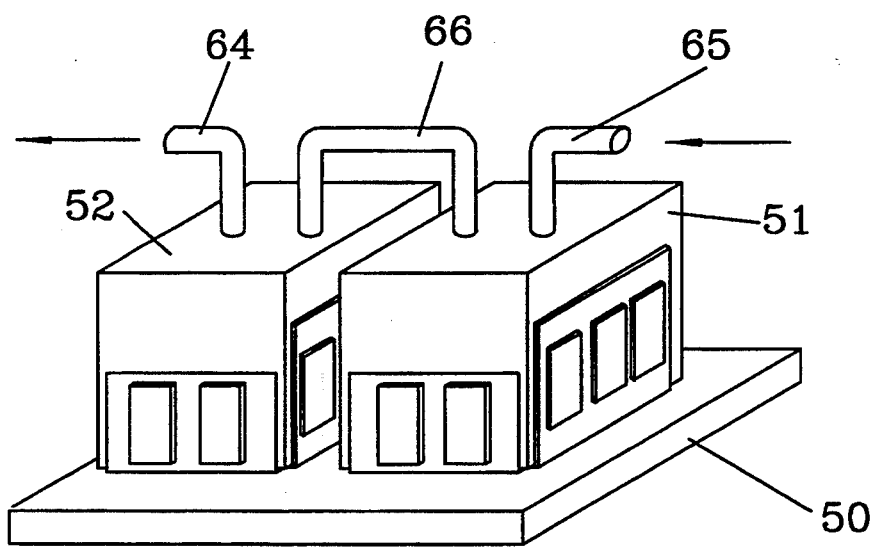
FIG. 7 shows dual fluid cooled heat sink modules.

FIG. 7 shows implementation of liquid cooled modules. Cooling liquid enters tube 65, flows through heat sink 51, out through tube 66 to heat sink 52. The cooling fluid leaves heat sink 52 and is returned to the coolant reservoir and pump for cooling and recycling.

What is claimed:

1. A three dimensional multi-chip module with integral heat sink, comprising:
   an integrated circuit mounted on a printed wiring board having electrical contacts and conductors thereon;
   a heat sink mounted over the integrated circuit and secured to the printed wiring board;
   a plurality of submodules, having semiconductor devices thereon, mounted on sides of the heat sink, each submodule having flexible circuit connectors, and extending under the heat sink making electrical contact with the printed wiring board and the integrated circuit, and held in place and secured to the printed circuit board by the heat sink; and
   locating pins on the printed wiring board positioning the submodules over the electrical contacts on the printed wiring board.

2. A three dimensional multi-chip module with integral heat sink, comprising:
   an integrated circuit mounted on a printed wiring board having electrical contacts and conductors thereon;
   a heat sink mounted over the integrated circuit; and
   a plurality of submodules, having semiconductor devices thereon, mounted on sides of the heat sink, each submodule having a flexible circuit connector, and extending under the heat sink making electrical contact with the printed wiring board and the integrated circuit.

3. The module and heat sink assembly of claim 1, wherein the printed wiring board has contact pads thereon and the integrated circuit and submodules make electrical contact with the printed wiring board through the contact pads.

4. The module and heat sink assembly of claim 2, wherein said heat sink is secured to the printed wiring board and clamps the integrated circuit and submodules to the printed wiring board, holding them mounted in place.

5. The module and heat sink assembly of claim 2, wherein the heat sink is generally rectangular, having four vertical sides, and each vertical side has a submodule mounted thereon.

6. The module and heat sink assembly of claim 2, wherein said printed wiring board has locating pins thereon, the parts of the submodules extending under the heat sink have holes therein through which the locating pins extend, positioning the submodules over and in contact with the contacts on the printed wiring board.

7. A three dimensional multi-chip module with integral heat sink, comprising:
   an integrated circuit mounted on a printed wiring board having electrical contacts and conductors thereon;
   a heat sink mounted over the integrated circuit and secured to the printed wiring board; and
   a plurality of submodules, having semiconductor devices thereon, mounted on sides of the heat sink, each submodule having flexible circuit connectors, and extending under the heat sink making electrical contact with the printed wiring board and the integrated circuit, and held in place and secured to the printed wiring board by the heat sink.

8. The module and heat sink assembly of claim 7, wherein the printed wiring board has contact pads thereon and the integrated circuit and submodules make electrical contact with the printed wiring board through the contact pads.

9. The module and heat sink assembly of claim 7, wherein the heat sink is generally rectangular, having four vertical sides, and each vertical side has a submodule mounted thereon.

10. The module and heat sink assembly of claim 7, wherein said printed wiring board has locating pins thereon, the parts of the submodules extending under the heat sink have holes therein through which the locating pins extend, positioning the submodules over and in contact with the contact pads on the printed wiring board.

11. The module and heat sink assembly according to claim 7, wherein the heat sink is liquid cooled.

* * * * *